United States Patent
Kim

(10) Patent No.: US 10,806,040 B2
(45) Date of Patent: Oct. 13, 2020

(54) LARGE DISPLAY DEVICE HAVING PARTIALLY CURVED PART

(71) Applicant: TOVIS CO., LTD., Incheon (KR)

(72) Inventor: Yong Beom Kim, Incheon (KR)

(73) Assignee: TOVIS CO., LTD., Incheon (KR)

( * ) Notice: Subject to any disclaimer, the term of this patent is extended or adjusted under 35 U.S.C. 154(b) by 0 days.

(21) Appl. No.: 16/344,028

(22) PCT Filed: Oct. 11, 2017

(86) PCT No.: PCT/KR2017/011194
§ 371 (c)(1),
(2) Date: Apr. 23, 2019

(87) PCT Pub. No.: WO2018/080051
PCT Pub. Date: May 3, 2018

(65) Prior Publication Data
US 2019/0343009 A1    Nov. 7, 2019

(30) Foreign Application Priority Data
Oct. 26, 2016   (KR) ........................ 10-2016-0140428

(51) Int. Cl.
*H05K 5/00* (2006.01)
*G06F 3/041* (2006.01)
(Continued)

(52) U.S. Cl.
CPC .......... *H05K 5/0017* (2013.01); *G06F 3/041* (2013.01); *G09F 9/30* (2013.01); *H05K 5/0021* (2013.01); *H05K 5/0217* (2013.01)

(58) Field of Classification Search
CPC .. H05K 5/0217; H05K 5/0021; H05K 5/0017; G09F 9/30; G06F 3/041; G02F 1/13336; G02F 1/133308; G07F 17/3211
(Continued)

(56) References Cited

U.S. PATENT DOCUMENTS

2008/0303976 A1* 12/2008 Nishizawa ........ G02F 1/133305
                                                                        349/64
2014/0126183 A1*  5/2014 Geng ..................... G02B 5/045
                                                                        362/97.1
(Continued)

FOREIGN PATENT DOCUMENTS

KR        10-1113734 B1     2/2012
KR     10-2015-0006331 A    1/2015
(Continued)

OTHER PUBLICATIONS

International Search Report for PCT/KR2017/011194 dated Jan. 23, 2018 from Korean Intellectual Property Office.

*Primary Examiner* — Mark Edwards
(74) *Attorney, Agent, or Firm* — Revolution IP, PLLC

(57) ABSTRACT

A large-sized display device having a partially curved part, includes: a partially curved transparent panel fixing plate comprising a curved part, formed so as to have a predetermined curved surface, and a flat part, formed so as to be continuous with the curved part; a curved display panel formed so as to have a curved surface corresponding to the curved surface of the curved part for displaying an image through the panel fixing plate; and a flat display panel installed at the flat part for displaying an image through the panel fixing plate.

4 Claims, 7 Drawing Sheets

(51) Int. Cl.
*G09F 9/30* (2006.01)
*H05K 5/02* (2006.01)

(58) Field of Classification Search
USPC .......................................................... 345/173
See application file for complete search history.

(56) References Cited

U.S. PATENT DOCUMENTS

| | | | |
|---|---|---|---|
| 2015/0009587 A1* | 1/2015 | Kim | G02B 5/045 |
| | | | 359/837 |
| 2015/0286457 A1 | 10/2015 | Kim et al. | |
| 2015/0287365 A1* | 10/2015 | Song | G09G 3/3611 |
| | | | 345/206 |
| 2016/0055703 A1* | 2/2016 | Woels | G07F 17/3213 |
| | | | 463/20 |
| 2017/0038928 A1 | 2/2017 | Park et al. | |

FOREIGN PATENT DOCUMENTS

| | | |
|---|---|---|
| KR | 10-2015-0007872 A | 1/2015 |
| KR | 10-2015-0115618 A | 10/2015 |
| KR | 10-2015-0116218 A | 10/2015 |
| KR | 10-2015-0118516 A | 10/2015 |

* cited by examiner

[FIG.1]
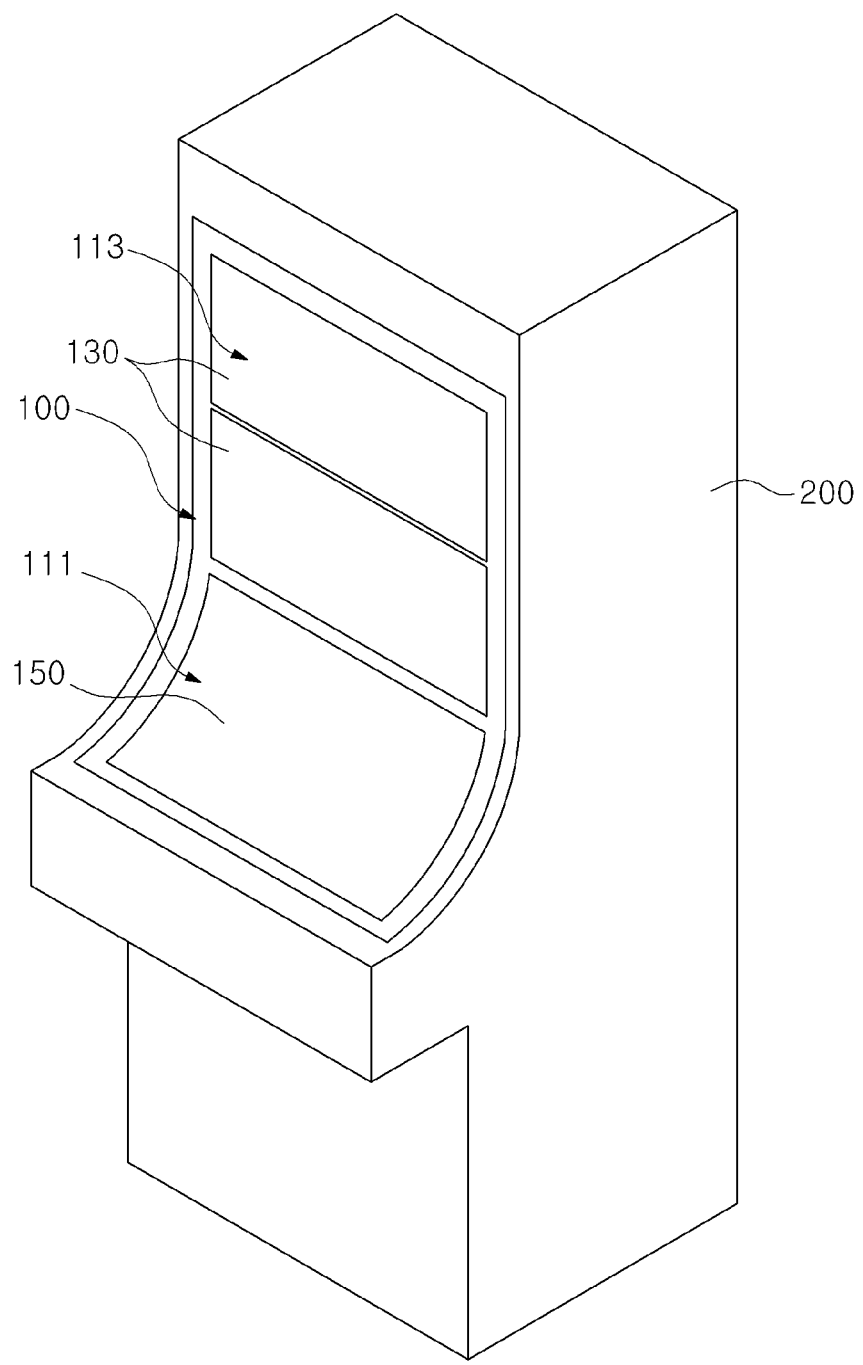

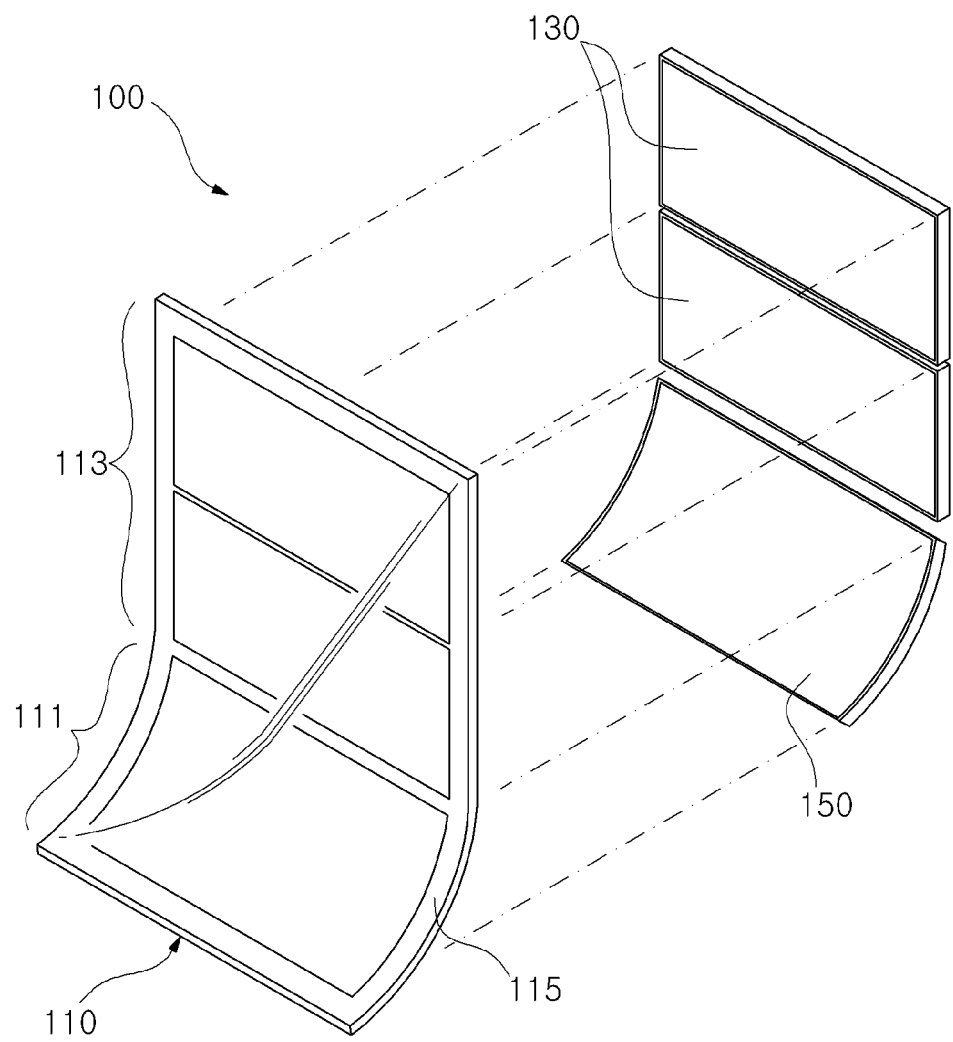

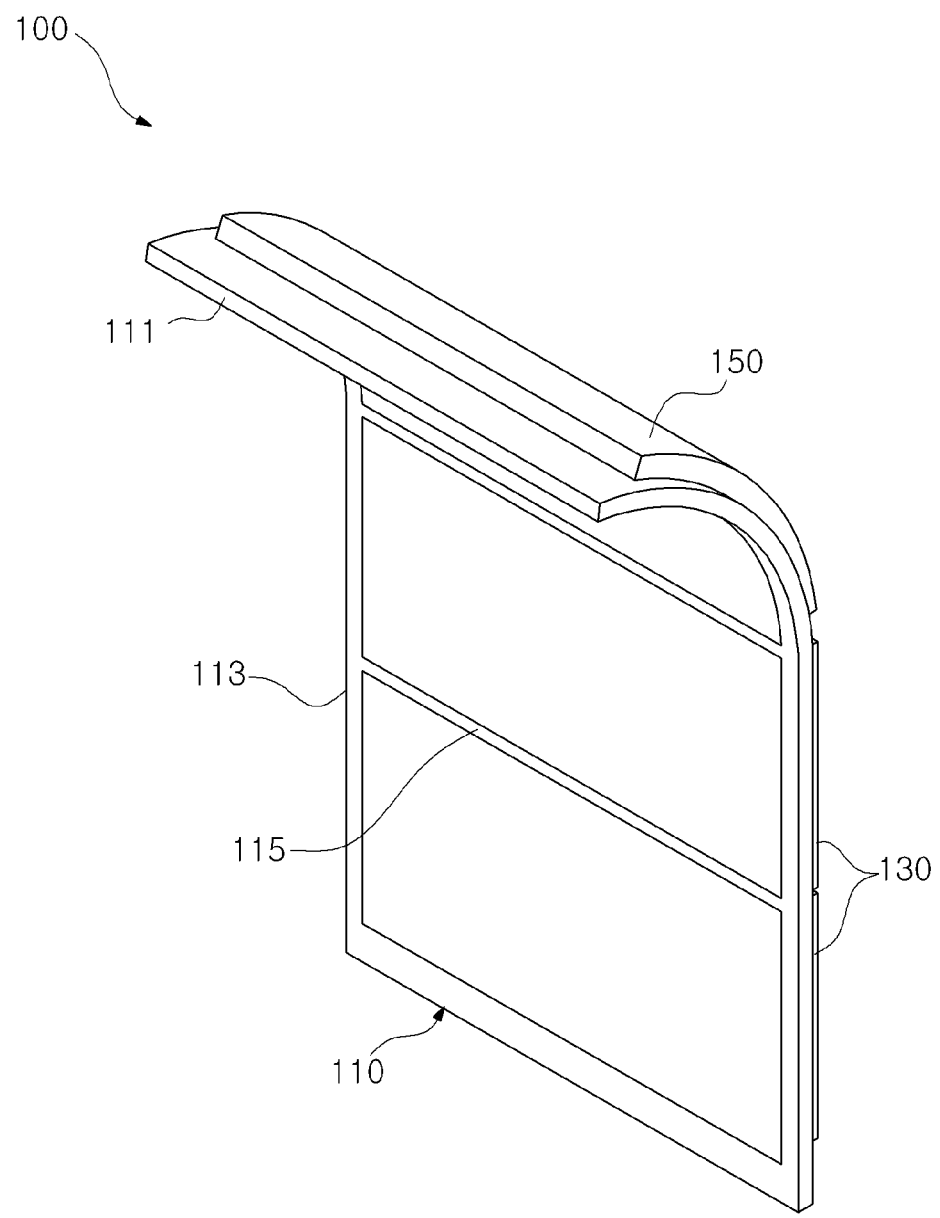
[FIG.3]

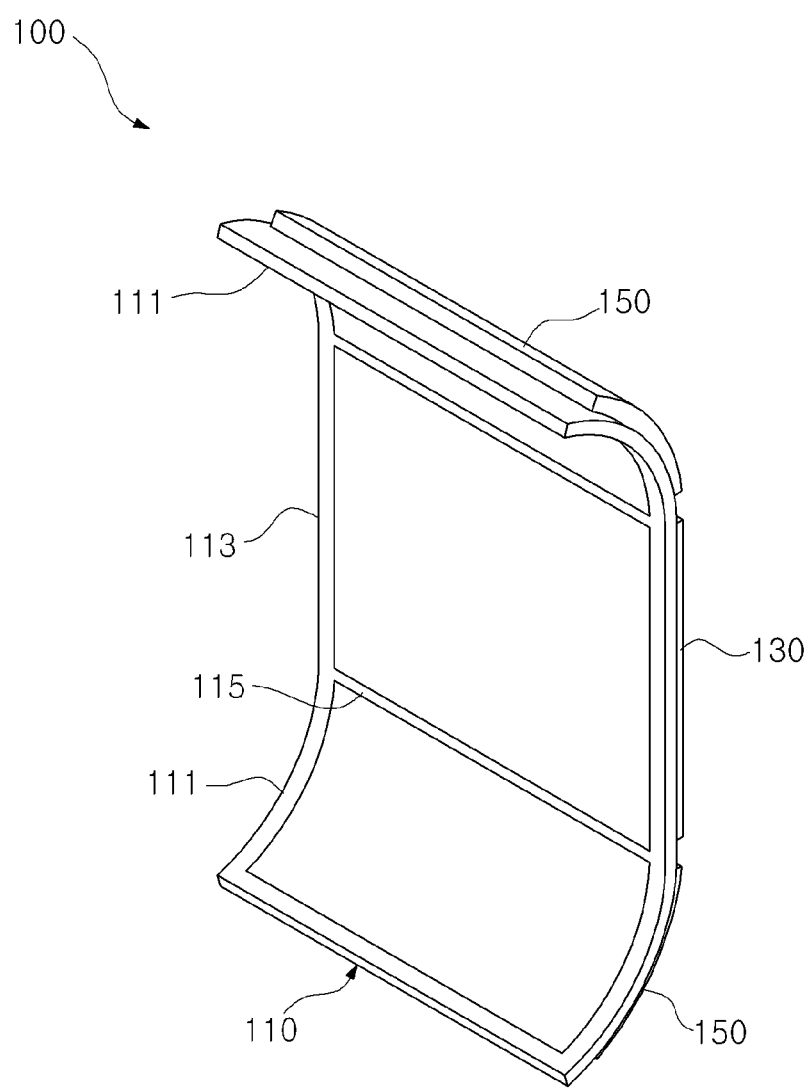

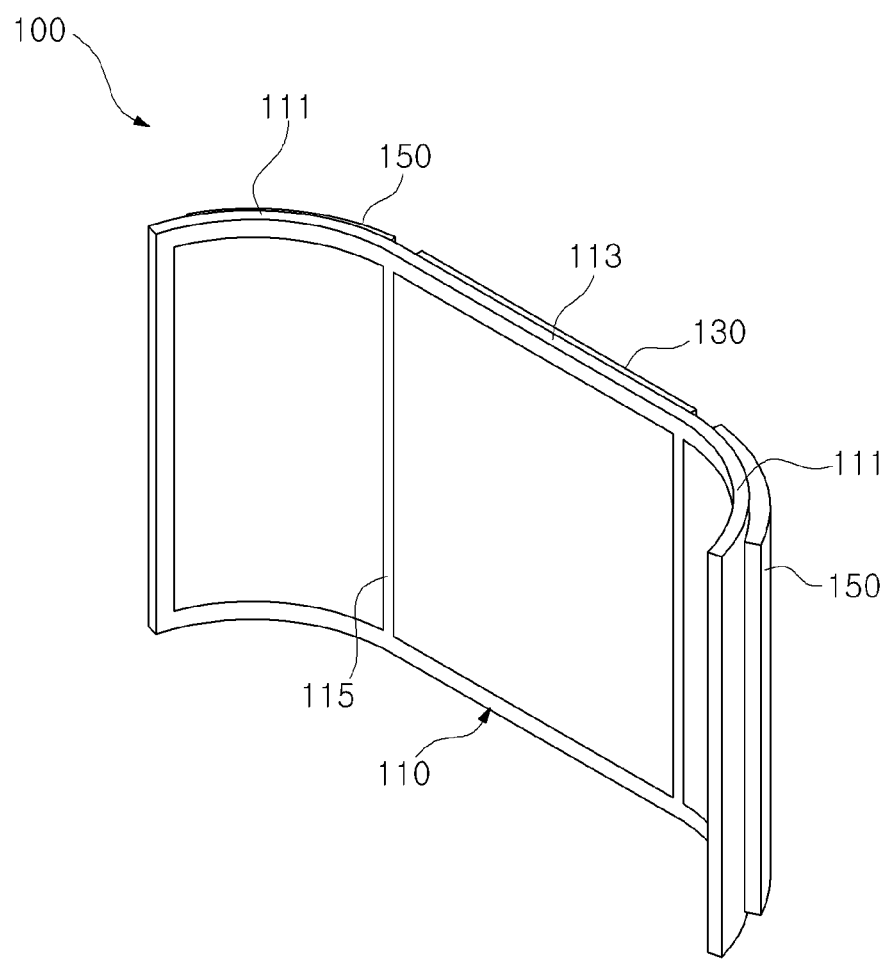
[FIG.5]

[FIG.6]
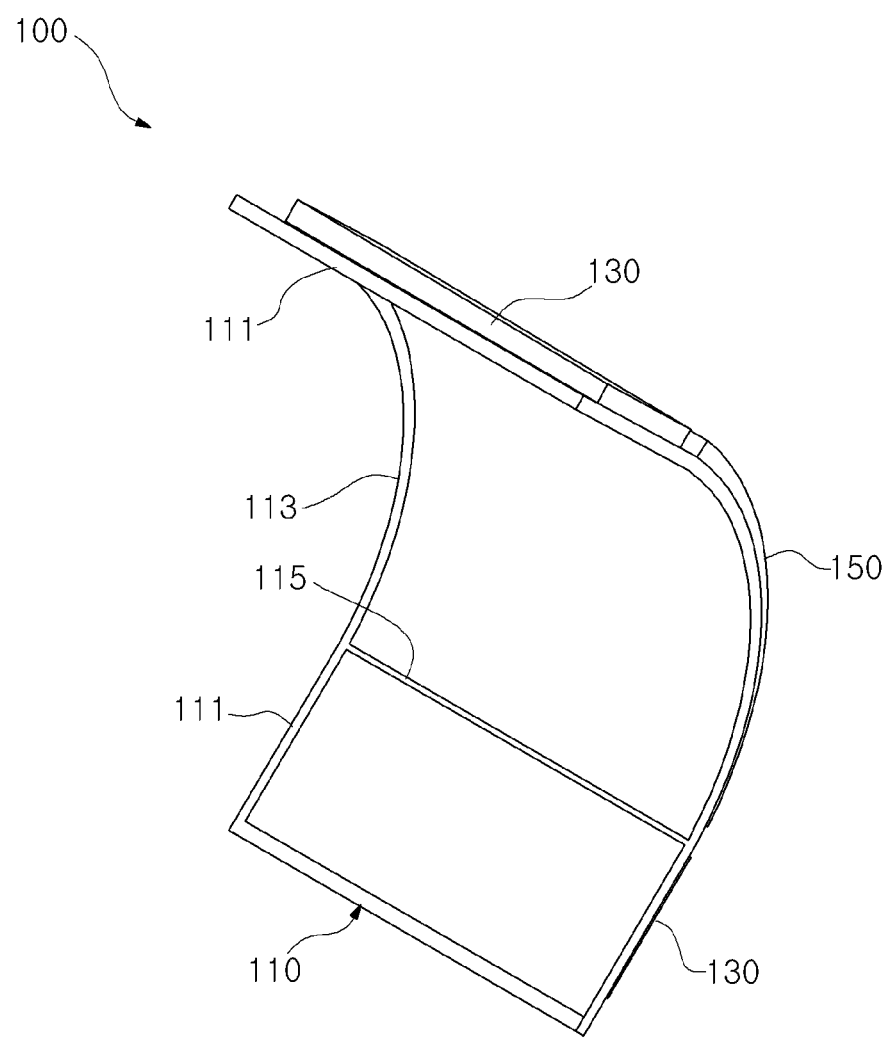

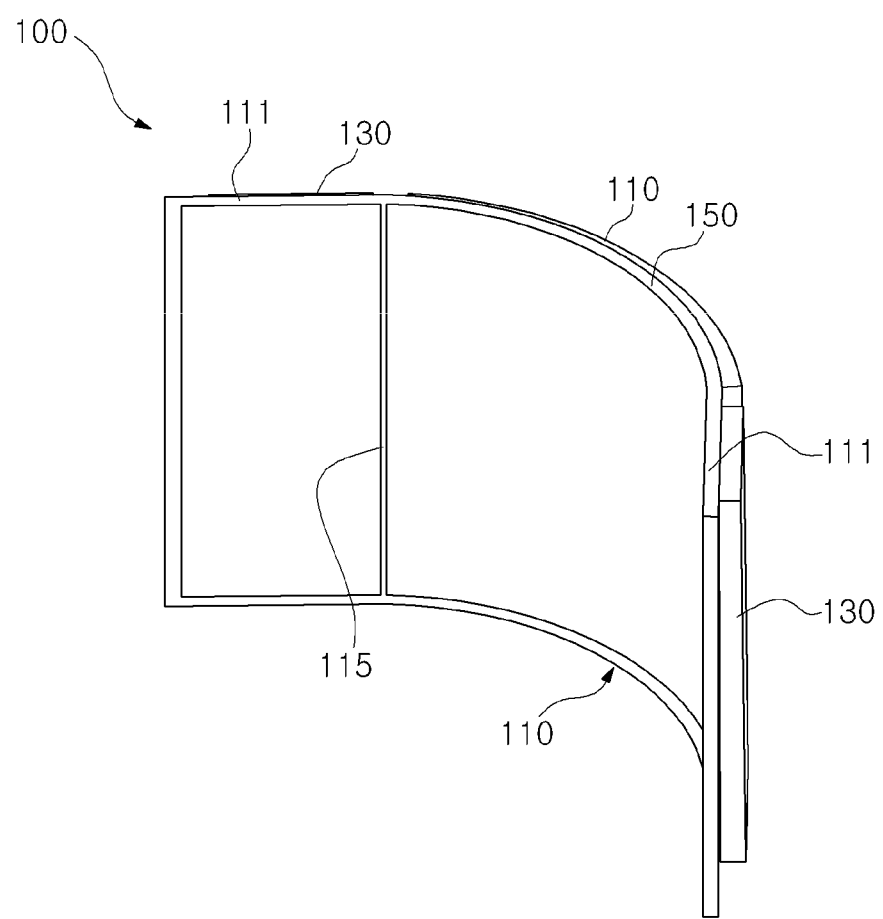

LARGE DISPLAY DEVICE HAVING PARTIALLY CURVED PART

TECHNICAL FIELD

The present invention relates to a large-sized display device for displaying an image.

BACKGROUND ART

In general, a display device is a device that displays an image. With a recent increase in the size of the display device, a curved display device has been proposed in order to improve the sense of immersion.

Meanwhile, a curved display device is manufactured as disclosed in Korean Registered Patent Publication No. 10-1113734 (published on Feb. 27, 2012).

The conventional method of manufacturing the curved display panel is a curved display panel manufacturing method that is capable of manufacturing a desired curved display panel using a flat display panel including a first substrate and a second substrate, which face each other, and includes a step of cutting at least a portion of the outside of each of the first substrate and the second substrate such that the thickness of each of the first substrate and the second substrate is reduced to a predetermined thickness and a step of forming a fixing layer at the portions of the edge of the outside of each of the first substrate and the second substrate that are located near the corners, the portions not being curved in the state in which each of the first substrate and the second substrate is formed so as to have a desired curved shape.

In the conventional curved display panel manufacturing method, configured as described above, the opposite surfaces of the display panel are cut using an etching solution in order to reduce the thickness of the display panel, and then the fixing layer, which is formed so as to have a desired curved surface, is attached to the display panel in order to manufacture a curved display device.

In the curved display device manufactured using the conventional curved display panel manufacturing method, however, it is necessary to increase the size of manufacturing equipment in order to manufacture a large-sized display device having a size of 42 inches or more. As a result, manufacturing costs are increased. In addition, in the case in which the display panel is damaged while the display panel is bent so as to be curved, it is not possible to reuse the damaged display panel, whereby manufacturing yield is reduced.

DISCLOSURE

Technical Problem

The present invention has been made in view of the above problems, and it is an object of the present invention to provide a large-sized display device having a partially curved part configured such that it is possible to replace only the portion of a curved display device that is damaged while the curved display device is manufactured, such that it is not necessary to increase the size of manufacturing equipment, whereby it is possible to reduce manufacturing costs, and such that it is possible to replace only a curved part, whereby it is possible to increase manufacturing yield.

Technical Solution

In accordance with the present invention, the above and other objects can be accomplished by the provision of a large-sized display device having a partially curved part, the large-sized display device including a partially curved transparent panel fixing plate including a curved part, formed so as to have a predetermined curved surface, and a flat part, formed so as to be continuous with the curved part, a curved display panel formed so as to have a curved surface corresponding to the curved surface of the curved part for displaying an image through the panel fixing plate, and a flat display panel installed at the flat part for displaying an image through the panel fixing plate.

The panel fixing plate may include a masking part for masking an edge between the curved display panel and the flat display panel so as to cover the edge.

Two or more flat display panels may be installed at the flat part.

Flat parts may be formed at opposite sides of the curved part so as to be continuous therewith.

One of the curved display panel and the flat display panel may include a touch panel for generating a touch signal.

Advantageous Effects

According to the present invention, a curved display panel and a flat display panel are installed at a panel fixing plate including a curved part and a flat part, which are formed so as to be continuous with each other, the curved display panel and the flat display panel corresponding to the curved part and the flat part, respectively, in order to manufacture a large-sized display device. In the case in which the display panel is damaged while the display panel is bent so as to be curved, therefore, it is not necessary to replace the entirety of the display panel, whereby it is possible to improve the manufacturing yield of a display device having a partially curved part.

In addition, a plurality of relatively small-sized display panels is attached to the panel fixing plate in order to manufacture a large-sized display device. Consequently, it is not necessary to increase the size of manufacturing equipment, whereby it is possible to reduce manufacturing costs.

In addition, in the case in which one of the display panels breaks down, it is possible to replace only the broken-down one of the display panels ne, whereby it is possible to reduce maintenance costs.

DESCRIPTION OF DRAWINGS

FIG. 1 is a perspective view showing the state in which a large-sized display device having a partially curved part according to an embodiment of the present invention is installed at a game machine;

FIG. 2 is an exploded perspective view showing the large-sized display device having the partially curved part according to the embodiment of the present invention;

FIG. 3 is a view showing a modification of the large-sized display device having the partially curved part according to the embodiment of the present invention, configured such that the large-sized display device is inverted;

FIG. 4 is a view showing another modification of the large-sized display device having the partially curved part according to the embodiment of the present invention, configured such that an upper curved part and a lower curved part are formed at opposite sides of a middle flat part;

FIG. 5 is a view showing another modification of the large-sized display device having the partially curved part according to the embodiment of the present invention, configured such that the large-sized display device shown in FIG. 4 is rotated 90 degrees;

FIG. 6 is a view showing another modification of the large-sized display device having the partially curved part according to the embodiment of the present invention, configured such that an upper flat part and a lower flat part are formed at opposite sides of a middle curved part; and FIG. 7 is a view showing a further modification of the large-sized display device having the partially curved part according to the embodiment of the present invention, configured such that the large-sized display device shown in FIG. 6 is rotated 90 degrees.

BEST MODE

Hereinafter, an embodiment of the present invention will be described with reference to the accompanying drawings.

FIG. 1 is a view showing the case in which a large-sized display device 100 having a partially curved part according to the present invention is applied to a game machine 200. Alternatively, the large-sized display device may be applied to various kinds of devices, such as a signboard, an information board, an automated teller machine (ATM), and a sales kiosk.

Meanwhile, in the preset invention, "large-sized display device" means a display device having a diagonal length of more than 42 inches.

As shown in FIGS. 1 and 2, a large-sized display panel having a partially curved part according to an embodiment of the present invention may include a panel fixing plate 110.

The panel fixing plate 110 may be formed so as to have a size corresponding to the size of the display device that is manufactured by assembling display panels 130 and 150, a description of which will follow, so as to constitute a large-sized screen.

Meanwhile, the panel fixing plate 110 may include a partially curved part 111, and may include a flat part 113, which is continuous with the curved part 111.

The panel fixing plate 110 may be made of a transparent material, such as glass or synthetic resin.

Meanwhile, the panel fixing plate 110 may include a masking part 115.

The masking part 115 may cover the edges of the display panels, a description of which will follow, exposed through the panel fixing plate 110 in order to improve the aesthetically pleasing appearance of the display panels, and at the same time, may mask the panel fixing plate 110 in order to cover the remaining portions of the display panels excluding image display regions, on which images are displayed, so as to avoid distracting from the images displayed on the display panels.

Meanwhile, the masking part 115 may have a black color. Ink may be applied or a sheet may be attached in order to realize the masking part.

The masking part 115 may be formed in order to divide the curved part 111 or the flat part 113 into a plurality of parts such that a plurality of display panels 130 and 150 is installed at the curved part 111 or the flat part 113 in order to cover the edges of the display panels 130 and 150 installed so as to constitute the curved part 111 or the flat part 113.

The large-sized display device 100 having the partially curved part according to the embodiment of the present invention may include a curved display panel 150.

The curved display panel 150 may be attached to the panel fixing plate 110 so as to display an image, and may be formed so as to have a curved surface corresponding to the curved part 111 of the panel fixing plate 110 such that the curved display panel is installed at the curved part 111 in tight contact therewith.

Meanwhile, the curved display panel 150 may receive an image source from a source provision device, such as a computer or a media reproduction device, in order to display an image.

Here, the curved display panel 150 may be a curved display panel 150 manufactured by thinly etching the thickness of a ready-made flat display panel 130 such that the display panel is curved so as to have a desired curved surface, or may be manufactured by attaching a flat display panel 130, the thickness of which has been reduced, to the curved part 111 such that the flat display panel is curved so as to have a curved surface corresponding to that of the curved part 111, whereby the flat display panel is curved.

In the case in which the curved part 111 of the panel fixing plate 110 has a large curvature, different curvatures, or a large size, a plurality of curved display panels 150 may be installed at the curved part 111.

Meanwhile, the curved display panel 150 may be realized as an organic light-emitting diode (OLED) or a liquid crystal display (LCD).

In addition, the curved display panel 150 may be attached to the panel fixing plate 110 via a double-sided adhesive tape, an adhesive, or a bracket.

The curved display panel 150 may be installed so as to face a screen for displaying an image at the rear surface of the panel fixing plate 110 such that a viewer views an image through the panel fixing plate 110.

The large-sized display device 100 having the partially curved part according to the embodiment of the present invention may include a flat display panel 130.

The flat display panel 130 may be attached to the flat part 113 of the panel fixing plate 110 in order to display an image.

Meanwhile, the flat display panel 130 may receive an image source from a source provision device, such as a computer or a media reproduction device, in order to display an image.

A plurality of flat display panels 130 may be installed at the flat part 113 of the panel fixing plate 110, and the flat display panel may be realized as an OLED or an LCD.

In addition, the flat display panel 130 may be attached to the panel fixing plate 110 via a double-sided adhesive tape, an adhesive, or a bracket.

The flat display panel 130 may be installed so as to face a screen for displaying an image at the rear surface of the panel fixing plate 110 such that a viewer views an image through the panel fixing plate 110.

In this embodiment, two flat display panels 130 are installed at the flat part 113. Alternatively, a single flat display panel 130 or a plurality of flat display panels 13 may be installed.

The large-sized display device 100 having the partially curved part according to the embodiment of the present invention may include a touch panel.

The touch panel may generate a touch signal when a viewer touches the touch panel for manipulation by the viewer.

Meanwhile, the touch panel may be one or both of the curved part 111 and the flat part 113 of the panel fixing plate 110 such that an image for touch is displayed in an image displayed on the curved display panel 150 installed at the curved part 111 or the flat display panel 130 installed at the flat part 113.

Meanwhile, the touch panel may be a transparent touch panel, through which an image is viewed.

The large-sized display device 100 having the partially curved part according to the embodiment of the present invention may include a driving unit (not shown).

The driving unit may supply power necessary to operate the curved display panel 150, the flat display panel 130, or the touch panel, and may include a controller for controlling the curved display panel 150, the flat display panel 130, or the touch panel.

Of course, the driving unit may include a source provision device for providing an image to be displayed on the curved display panel 150 or the flat display panel 130.

Hereinafter, the operation and effects between the respective components of the large-sized display device described above will be described.

In the large-sized display device 100 having the partially curved part according to the embodiment of the present invention, the panel fixing plate 110 is formed so as to have a flat shape, and includes the partially curved part 111 and the flat part 113, which is continuous with the curved part 111. The curved display panel 150, which is curved so as to correspond to the curved part 111, is attached to the curved part 111, and the flat display panel 130 is attached to the flat part 113.

At this time, a single curved display panel 150 or a single flat display panel 130 may be attached to each of the flat part 113 and the curved part 111. Alternatively, a plurality of flat display panels 130 or a plurality of curved display panels 150 may be attached to each of the flat part and the curved part depending on the sizes of the flat part 113 and the curved part 111 or the curvature of the curved part 111.

The touch panel may be attached to one or both of the flat part 113 and the curved part 111.

In the large-sized display device having the partially curved part according to the embodiment of the present invention, configured as described above, the curved display panel 150 and the flat display panel 130 display a single image in a divided state such that the curved display panel and the flat display panel convey a sense of unity, thereby enabling a viewer to perceive the large-sized display device 100, a portion of which is curved, as a single unit.

At this time, of course, the curved display panel 150 and the flat display panel 130 may display different images.

In addition, the touch panel may be installed at one or both of the flat part 113 and the curved part 111 such that a viewer directly performs manipulation in response to the images displayed on the curved display panel 150 and the flat display panel 130.

FIGS. 3 to 7 are views showing various modifications of the embodiment of the present invention. FIG. 3 is a view showing the case in which the large-sized display device according to the embodiment of the present invention is inverted, FIG. 4 is a view showing the case in which curved parts 111, which are continuous with the flat part 113, are formed at the upper portion and the lower portion of the flat part 113, FIG. 5 is a view showing the case in which the large-sized display device shown in FIG. 4 is rotated 90 degrees, FIG. 6 is a view showing the case in which flat parts 113, which are continuous with the curved part 111, are formed at the upper portion and the lower portion of the curved part 111, and FIG. 7 is a view showing the case in which the large-sized display device shown in FIG. 6 is rotated 90 degrees.

Although some modifications are shown in FIGS. 3 to 7, the present invention is not limited as to the shapes of the large-sized display device shown in figures. In addition to the representations of the large-sized display device shown in the figures, it is possible to manufacture various shapes of display devices including the curved part 111 and the flat part 113.

In the large-sized display device having the partially curved part according to the embodiment of the present invention, therefore, display panels having shapes corresponding to those of the curved part 111 and the flat part 113 are installed at the curved part 111 and the flat part 113, whereby it is possible to easily manufacture a large-sized display device having a curved part and to improve manufacturing yield.

In the case in which a large-sized display panel itself is partially curved in order to manufacture a partially curved display device, in the same manner as in the conventional art, the display panel may be damaged while the display panel is bent so as to be curved. In this case, the entire display panel must be discarded. In the present invention, however, the curved display panel 150 is separately manufactured and is then attached to the curved part 111, whereby it is not necessary to discard the large-sized display panel in its entirety, thus reducing manufacturing costs.

In order to manufacture the large-sized display panel such that only a portion of the large-sized display panel is curved, it is necessary to increase the size of equipment that is necessary to bend the large-sized display panel such that the large-sized display panel is curved. In the present invention, however, the curved display panel 150 is separately manufactured and is then attached to the curved part 111. Consequently, it is not necessary to increase the size of equipment necessary to bend the display panel such that the display panel is curved, whereby it is possible to reduce manufacturing costs.

In addition, in the case in which one of the display panels 130 and 150 breaks down, it is possible to replace only the broken-down one of the display panels 130 and 150, whereby it is possible to reduce maintenance costs.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

DESCRIPTION OF REFERENCE NUMERALS

100: Large-sized display device having partially curved part

| 110: Panel fixing plate | 111: Curved part |
|---|---|
| 113: Flat part | 115: Masking part |
| 130: Flat display panel | 150: Curved display panel |

INDUSTRIAL APPLICABILITY

The present invention is applicable to various display fields for displaying images, such as digital signage, medical instruments, and game machines.

The invention claimed is:

1. A large-sized display device having a partially curved part, the large-sized display device comprising:
    a panel fixing plate which is partially curved and transparent comprising a curved part having a predetermined curved surface, and a flat part being continuous with the curved part; and a display panel comprising one or more curved display panels and one or more flat display panels, the one or more curved display panels formed so as to have a curved surface corresponding to the curved surface of the curved part for displaying an image through the panel fixing plate, and the one or more flat display panels installed at the flat part for displaying an image through the panel fixing plate, wherein the panel fixing plate comprises a masking part for masking an edge between the one or more curved display panels and the one or more flat display panels so as to cover the edge, the masking part being applied or attached to the panel fixing plate.

2. The large-sized display device according to claim 1, wherein two or more flat display panels are installed at the flat part.

3. The large-sized display device according to claim 1, wherein flat parts are formed at opposite sides of the curved part so as to be continuous therewith.

4. The large-sized display device according to claim 1, wherein the one or more curved display panels and the one or more flat display panels comprise a touch panel for generating a touch signal.

\* \* \* \* \*